United States Patent [19]

Quessada

[11] Patent Number: 5,077,586
[45] Date of Patent: Dec. 31, 1991

[54] VDMOS/LOGIC INTEGRATED CIRCUIT COMPRISING A DIODE

[75] Inventor: Daniel Quessada, Pourrieres, France

[73] Assignee: SGS-Thomson Microelectronics S.A., Gentilly, France

[21] Appl. No.: 557,842

[22] Filed: Jul. 26, 1990

[30] Foreign Application Priority Data

Jul. 27, 1989 [FR] France ................... 89 10386

[51] Int. Cl.$^5$ ............ H01L 29/48; H01L 29/56; H01L 27/02; H01L 29/34
[52] U.S. Cl. ................................. 357/15; 357/42; 357/43; 357/52; 357/023.400; 357/41
[58] Field of Search ............... 357/15, 23.4, 23.5, 357/42, 43, 46, 52

[56] References Cited

U.S. PATENT DOCUMENTS

| 4,811,065 | 3/1989 | Cogan | 357/15 |
| 4,874,714 | 10/1989 | Eklund | 357/15 |
| 4,887,142 | 12/1989 | Bertotti et al. | 357/42 |

FOREIGN PATENT DOCUMENTS 0123093 10/1984 European Pat. Off. .
0213425 11/1987 European Pat. Off. .
0294888 12/1988 European Pat. Off. .

OTHER PUBLICATIONS

"Silicon Processing for the ULSI ERA", Wolf, Lattice Press, 1990, pp. 321–322, Fig. 5-12.

Primary Examiner—William Mintel
Assistant Examiner—Mahshid Saadat
Attorney, Agent, or Firm—Lowe, Price, LeBlanc & Becker

[57] ABSTRACT

An integrated circuit includes a vertical power transistor, a depletion-mode lateral MOS logic transistor and a lateral Schottky diode in an N+ epitaxial semiconductor layer of an N substrate. The depletion-mode lateral transistor and Schottky diode are in a P well formed in the epitaxial layer during a first doping step. The vertical power transistor and depletion-mode lateral transistor include P+ semiconductor regions formed during a second doping step. The lateral transistor and Schottky diode include an N doped semiconductor channel layer formed during a third doping step so they have similar characteristics. The vertical power transistor includes a P doped semiconductor channel layer formed during a fourth doping step. The lateral transistor, Schottky diode and channel of the vertical power transistor include $N^{30}$ doped semiconductor regions formed during a fifth doping step. The semiconductor region formed during the fifth step associated with the Schottky diode forms a ring around the layer of the diode formed during the third step. Metal electrodes are formed on regions of the transistors and diode as formed during the fifth step and on the diode layer formed during the third step and on regions formed during the second step. The layer formed during the third step forms a junction about $0.7\mu$ below the substrate and has a surface dopant concentration of about $10^{16}$ atoms/cm$^3$.

19 Claims, 1 Drawing Sheet

VDMOS/LOGIC INTEGRATED CIRCUIT COMPRISING A DIODE

BACKGROUND OF THE INVENTION

The present invention relates to integrated circuits including power and logic transistors on the same chip. It more particularly relates to an integrated circuit including a power transistor, a lateral MOS logic transistor and a Schottky diode and to a method of forming same.

FIG. 1 is a schematic section view of an integrated circuit described in European Application 87/00325.4 in the name of Thomson CSF. For the sake of simplicity only certain elements of this structure are illustrated (particularly certain thin and thick oxide layers are not shown). In the right-hand portion of FIG. 1 is an illustration of a cell of a power VDMOS (vertical diffused MOS) transistor 1 of the enhancement-mode type and in the left-hand portion of the figure are represented logic components such as a depletion-mode N-channel lateral MOS transistor 2 and an enhancement-mode N-channel lateral MOS transistor 3.

This structure is made on a substrate comprising an N-type layer 10 epitaxially grown on an N+-type silicon wafer 11.

In a first doping step are formed P-type regions 12, especially corresponding to wells wherein the logic portion of the chip is formed.

In a second doping step, P+ regions with a high doping level are formed, this doping level being high enough to obtain ohmic contacts with metallizations The P+ regions enable an ohmic contact with well 12 and regions 18 of the power VDMOS transistor to be formed to obtain contact with a so-called "bulk" region in an upper region where the channel is formed In a third doping step are formed N-type regions 13 especially corresponding to channel regions of the depletion-mode lateral MOS transistors.

Then, one conventionally forms (for example through oxidation, deposition of polycrystalline silicon, etching and reoxidation) gates 21 of the power transistor, gates 22 of the enhancement-mode lateral MOS transistors and gates 23 of the depletion-mode lateral MOS transistors. Gates 21 and 22 are simultaneously formed during this step.

A fourth P-type doping step in the region of the VDMOS transistor forms the channel regions 30 of those transistors with the gate regions acting as a mask.

Then, in a fifth doping step, one forms, by using the above-mentioned gates as a mask, N+ regions especially corresponding to the sources 32 of the power transistor and to the sources and drains 33-36 of the depletion-mode and enhancement-mode lateral MOS transistors.

Lastly, after oxidation and opening of appropriate windows, one forms a metallization layer wherein one etches the source metallization 41 of the power transistor and the source and drain metallizations 42-45 of the lateral transistors as well as other metallizations such as contact metallizations 46 of the wells wherein are formed logic components.

The rear surface of the component which corresponds to the drain of the VDMOS transistor 1 is coated with metallization 48.

In operation, such a structure is generally connected so that its rear surface 48 is at the highest positive voltage ($+V_{HT}$), all the other metallizations being at lower voltages and the metallization 46 of well 12 being usually grounded.

The above described structure is particularly advantageous due to its simplicity. Indeed, it requires a minimum number of masking and doping steps. As seen previously, only five doping types are used. However, this simplicity enables only a limited number of components to be realized in such a structure.

The user usually desires, while maintaining the low cost and reliability associated thereto, to have additional elementary components, such as for example PN diodes that are biased to operate in the forward direction (conductive with a voltage on the P region higher than the voltage on the N region).

FIG. 2 is an elementary drawing of a prior art embodiment of such a PN diode in a structure of the type shown in FIG. 1. The PN diode is formed between the enhancement-mode P region of well 12 and N+ region 50 formed in well 12. The upper surface of N+ region 50 is coated with metallization 51, and P+ region 52 (formed in well 12) is coated with metallization 53. Thus, a diode able to operate in the forward direction between metallizations 53 and 51 is effectively obtained.

However, in practical implementations, such a structure cannot be used. According to a first drawback, the well would be at a voltage set by the connection to metallization 53 and would no longer be maintained at ground, as is desirable. A second drawback of this prior art arrangement is that when the PN diode is conductive and current flows from metallization 53 towards metallization 51, this current constitutes the base current of parasitic NPN transistor 54. The emitter, base and collector of parasitic transistor 54 respectively correspond to (a) region 50, (b) well 12 and (c) the N/N+ substrate connected to metallization 48. Parasitic transistor 54 is a high quality transistor, that is, it has a high gain. If this gain is about 20-50, each time current flows between metallizations 53 and 51, a current 20 to 50 times higher would flow between metallizations 48 and 51. This current in the parasitic transistor flows parallel to the current flowing in power component 1. The current in parasitic transistor 54 is liable to have a very high amplitude which would cause the structure to be overheated and possibly destroyed.

Thus, it is not possible to realize in a simple way, with the above mentioned technology, diodes able to operate in the forward direction. To solve this problem the prior art has resorted, either to (1) more complex technologies by adding additional wells but without completely solving the problems associated with parasitic transistors, or (2) so-called active diode structures wherein a polarity detection causes an MOS transistor to become conductive. This second method may prove satisfactory but requires relatively complex circuits which necessitate an important silicon surface.

Thus, an object of the invention is to solve the encountered problem by using only five doping steps and a single metallization step including VDMOS-type vertical power MOS transistors and lateral logic transistors, and to the resulting structure to form a diode in an integrated circuit.

SUMMARY OF THE INVENTION

According to one aspect of the invention, an integrated circuit comprises a highly doped semiconductor substrate of a first conductivity type including a doped epitaxial semiconductor layer of the first conductivity type wherein the doped epitaxial layer includes a vertical power transistor, a depletion-mode lateral MOS logic transistor and a lateral Schottky diode. The depletion-mode lateral transistor and Schottky diode are in a well of a doped semiconductor material of a second conductivity type formed in the epitaxial layer during a first doping step. The vertical power transistor and depletion-mode lateral transistor include semiconductor highly doped regions of the second conductivity type formed during a second doping step. The regions formed during the second step enable ohmic contacts to be formed. The lateral transistor and Schottky diode include a doped semiconductor channel layer of the first conductivity type formed during a third doping step. The layer formed in the diode during the third step has characteristics similar to those of the channel of the lateral transistor formed during the third step. The vertical power transistor includes a doped semiconductor channel layer of the second conductivity type formed during a fourth doping step. The lateral transistor, Schottky diode and channel of the vertical power transistor include highly doped semiconductor regions of the first conductivity type formed during a fifth doping step. The semiconductor region formed during the fifth step associated with the Schottky diode forms a ring around the layer of the diode formed during the third step. Metal electrodes are formed on regions of the transistors and diode as formed during the fifth step and on the diode layer formed during the third step and on regions formed during the second step.

In accordance with a further aspect of the invention, an integrated circuit comprises a highly doped semiconductor substrate of a first conductivity type and includes a doped epitaxial semiconductor layer of the first conductivity type. The doped epitaxial layer includes a vertical power transistor, a depletion-mode lateral MOS logic transistor and a lateral Schottky diode. The depletion-mode lateral transistor and Schottky diode are in a well of a doped semiconductor material of a second conductivity type in the epitaxial layer. The vertical power transistor and depletion-mode lateral transistor include semiconductor highly doped regions of the second conductivity type. The highly doped regions of the second conductivity type enable ohmic contacts to be formed. The lateral transistor and Schottky diode include a doped semiconductor channel layer of the first conductivity type. The doped semiconductor layer of the first conductivity type in the diode has characteristics similar to those of the channel of the first conductivity type of the lateral transistors. The vertical power transistor includes a doped semiconductor channel layer of the second conductivity type. The lateral transistor, Schottky diode and channel of the vertical power transistor include highly doped semiconductor regions of the first conductivity type. The highly doped semiconductor region of the first conductivity type associated with the Schottky diode forms a ring around the doped semiconductor layer of the first conductivity type of the diode. Metal electrodes are formed on the highly doped semiconductor regions of the first conductivity type of the transistors and diode and on the doped semiconductor layer of the first conductivity type of the diode and on the highly doped regions of the second conductivity type.

In accordance with another aspect of the invention, an integrated circuit comprises a highly doped semiconductor substrate of a first conductivity type, including a doped epitaxial semiconductor layer of the first conductivity type. The doped epitaxial layer includes a vertical power transistor, a depletion-mode lateral MOS logic transistor and a lateral Schottky diode. The depletion-mode lateral transistor and Schottky diode are in a well of a doped semiconductor material of a second conductivity type formed in the epitaxial layer. The vertical power transistor and depletion-mode lateral transistor include semiconductor highly doped regions of the second conductivity type. The highly doped regions of the second conductivity type enable ohmic contacts to be formed. The lateral transistor and Schottky diode include a doped semiconductor channel layer of the first conductivity type formed during the same doping step. The vertical power transistor includes a doped semiconductor channel layer of the second conductivity type. The lateral transistor, Schottky diode and channel of the vertical power transistor include highly doped semiconductor regions of the first conductivity type. The highly doped semiconductor regions of the first conductivity type associated with the Schottky diode form a ring around the doped semiconductor layer of the first conductivity type of the diode. Metal electrodes are formed on the highly doped semiconductor regions of the first conductivity type of the transistors and diode and on the doped semiconductor layer of the first conductivity type of the diode and on the highly doped regions of the second conductivity type.

In accordance with an additional aspect of the invention, an integrated circuit comprises a highly doped semiconductor substrate of a first conductivity type, including a doped epitaxial layer of the first conductivity type. The doped epitaxial layer includes a vertical power transistor, a depletion-mode lateral MOS logic transistor and a lateral Schottky diode. The depletion-mode lateral transistor and Schottky diode are in a well of a doped semiconductor material of a second conductivity type in the epitaxial layer. The vertical power transistor and depletion-mode lateral transistor include semiconductor highly doped regions of the second conductivity type. The highly doped regions of the second conductivity type enable ohmic contacts to be formed. The lateral transistor and Schottky diode include doped semiconductor layers of the first conductivity type. The doped semiconductor layer of the first conductivity type of the Schottky diode forms a junction having a depth in the well of about $0.7\mu$ and a concentration of about $10^{16}$ atoms per $cm^3$. The vertical power transistor includes a doped semiconductor channel layer of the second conductivity type. The lateral transistor, Schottky diode and channel of the vertical power transistor include highly doped semiconductor regions of the first conductivity type. The highly doped semiconductor regions of the first conductivity type associated with the Schottky diode form a ring around the doped semiconductor layer of the first conductivity type of the diode. Metal electrodes are formed on the highly doped semiconductor regions of the first conductivity type of the transistors and diode and on the doped semiconductor layer of the first conductivity type on the diode and on the highly doped regions of the second conductivity type.

In the preferred embodiment, the metal electrodes are formed in a single cathode sputtering metallization step as an aluminum-silicon layer with about a 1% silicon dose.

BRIEF DESCRIPTION OF THE DRAWINGS

The foregoing and other objects, features and advantages of the invention will be apparent from the following detailed description of a preferred embodiment as illustrated in the accompanying figures wherein.

As conventional in the field of integrated circuit representation, the lateral sizes and the thicknesses of the various layers are not drawn to scale and these various layers or layer portions are arbitrarily enlarged to improve the legibility of the drawings.

DESCRIPTION OF A PREFERRED EMBODIMENT

Figure 1:
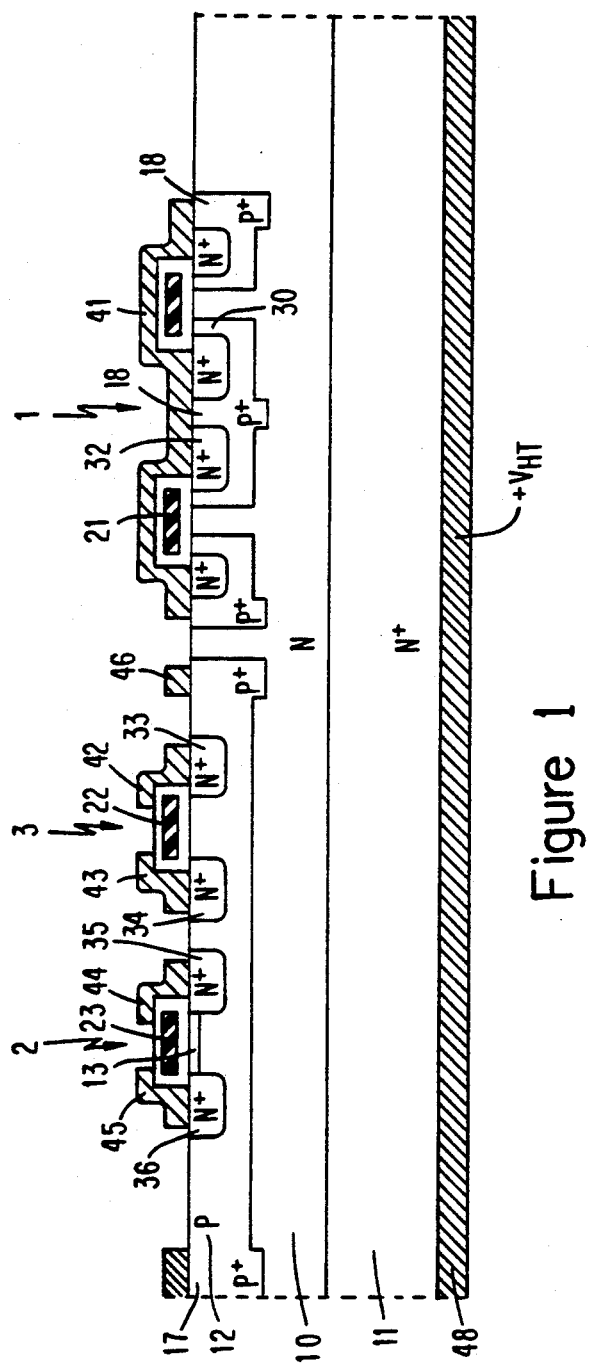
FIG. 1, designed to explain the state of the art, has been previously described.
Figure 3:
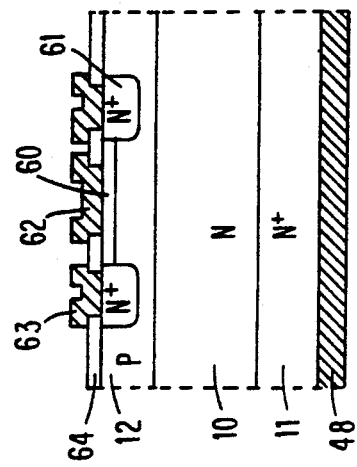
FIG. 3 is a schematic section view of a structure according to the invention.

FIG. 3 is a partial section view of a component according to the invention, formed in a structure of the type shown in FIG. 1. According to the invention, in P well 12, is formed an N-type region 60 resulting from the same doping as region 13 of FIG. 1 corresponding to the channels of the depletion-mode lateral MOS transistors. This region 60 is surrounded by an N+-type ring 61 corresponding to the same doping step as the drain and source regions 32–36 of the MOS transistors. The metallization layer is etched to form metallization 62 in contact with the upper surface of the N region 60 and metallization 63 in contact with the N+ring 61.

Figure 2:
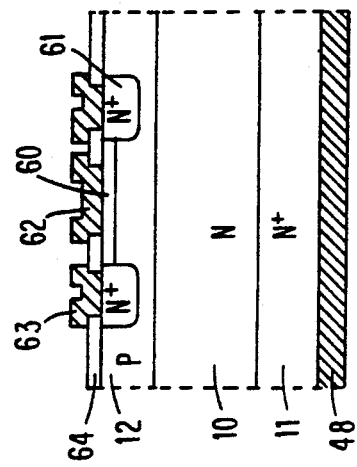
FIG. 2, designed to explain the problem encountered, has been previously described.

Moreover, in FIG. 3 is illustrated a silicon oxide layer 64. Layer 64 is actually present in the prior art structures of FIGS. 1 and 2 although it was not represented. According to a basic aspect of the invention, metallizations 62 and 63 are portions of the same metallization as metallizations 41–45 of FIG. 1. They may, for example, be made of aluminum-silicon.

With this structure, a diode operating in the forward direction between metallizations 62 and 63 is obtained. This diode has a Schottky diode structure but its operation is, in fact, substantially between a Schottky diode and a conventional PN diode when the metallization is aluminum-silicon metallization since aluminum diffusion probably occurs in N layer 60 to from a PN junction. In that case, if there is a PNP parasitic transistor between the diffusion resulting from metallization 62, the N-type region 60 and P well 12, such a transistor has a gain much lower than 1.

With the method used to make the structure the N-type diffusion 60, corresponding to the depletion-mode channel of the lateral MOS transistors, has a junction depth of 0.7 micrometer and a surface concentration of about $10^{16}$ atoms per cm$^3$ and the metallizations are formed through aluminum cathodic sputtering with a silicon dose of 1%. Thereby, one obtains a diode having forward voltage (VF) drop ranges from 0.4 to 0.6 volt. The diode reverse breakdown voltage is 30 volts and the leakage current is lower than 1 microampere for a reverse voltage of about 30 volts. The gain of the PNP parasitic transistor is lower than $10^{-1}$.

Thus, the invention permits a diode to be formed without adding any step to the conventional technological process for manufacturing structures having a VDMOS power transistor and logic circuits including lateral MOS transistors of the enhancement-mode and depletion-mode types.

Various modifications can be brought to this structure; for example it is possible to replace the aluminum-silicon metallization on the whole upper surface of the structure with another more suitable metallization for forming a Schottky diode on a low doped N layer while maintaining the satisfactory ohmic contact and conductivity features for N+ and P+ contacts.

On the other hand, although the invention has been describe in detail with a vertical power transistor of the MOS type, it also applies to power transistors of the bipolar type.

I claim:

1. An integrated circuit comprising a highly doped semiconductor substrate of a first conductivity type, the substrate including a doped epitaxial semiconductor layer of the first conductivity type, the doped epitaxial layer including:

a vertical power transistor, a depletion-mode lateral MOS logic transistor and a lateral Schottky diode;

the depletion-mode lateral transistor and Schottky diode being in a well of a doped semiconductor material of a second conductivity type formed in the epitaxial layer during a first doping step;

the vertical power transistor and depletion-mode lateral transistor including semiconductor highly doped regions of the second conductivity type formed during a second doping step, the regions formed during the second step enabling ohmic contacts to be formed;

the lateral transistor and Schottky diode including a doped semiconductor channel layer of the first conductivity type formed during a third doping step, the layer formed in the diode during the third step having characteristics similar to those of the channel of the lateral transistor formed during the third step;

the vertical power transistor including a doped semiconductor channel layer of the second conductivity type formed during a fourth doping step;

a lateral transistor, Schottky diode and channel of the vertical power transistor including highly doped semiconductor regions of the first conductivity type formed during a fifth doping step, the semiconductor region formed during the fifth step associated with the Schottky diode forming a ring around the layer of the diode formed during the third step; and metal electrodes on regions of the transistors and diode as formed during the fifth step and on the diode layer formed during the third step and on regions formed during the second step the regions and layers of said Schottky diode being polarized and the regions and layers being arranged so that, when the diode is forward biased, no parasitic transistor in shunt with the power transistor is formed.

2. The integrated circuit of claim 1 wherein the layer formed during the third step forms a junction about 0.7$\mu$ below the substrate surface and has a dopant concentration of about $10^{16}$ atoms/cm$^3$.

3. The integrated circuit of claim 1 wherein the metal electrodes are formed in a single cathode sputtering metallization step as an aluminum-silicon layer with about a 1% silicon dose.

4. An integrated circuit comprising a highly doped semiconductor substrate of a first conductivity type, the substrate including a doped epitaxial semiconductor layer of the first conductivity type, the doped epitaxial layer including:

a vertical power transistor, a depletion-mode lateral MOS logic transistor and a lateral Schottky diode;

the depletion-mode lateral transistor and Schottky diode being in a well of a doped semiconductor material of a second conductivity type in the epitaxial layer;

the vertical power transistor and depletion-mode lateral transistor including semiconductor highly doped regions of the second conductivity type, the highly doped regions of the second conductivity type enabling ohmic contacts to be formed;

the lateral transistor and Schottky diode including a doped semiconductor channel layer of the first conductivity type, the doped semiconductor layer of the first conductivity type in the diode having characteristics similar to those of the channel of the first conductivity type of the lateral transistor;

the vertical power transistor including a doped semiconductor channel layer of the second conductivity type;

the lateral transistor, Schottky diode and channel of the vertical power transistor including highly doped semiconductor regions of the first conductivity type, the highly doped semiconductor region of the first conductivity type associated with the Schottky diode forming a ring around the doped semiconductor layer of the first conductivity type of the diode; and metal electrodes forming ohmic contacts on the highly doped semiconductor regions of the first conductivity type of the transistors and diode and on the doped semiconductor layer of the first conductivity type of the diode and on the highly doped regions of the second conductivity type;

the regions and layers of said Schottky diode being polarized and the regions and layers being arranged so that, when the diode is forward biased, no parasitic transistor in shunt with the power transistor is formed.

5. The integrated circuit of claim 4 wherein the doped semiconductor layer of the first conductivity type of the Schottky diode and the lateral transistor forms a junction about $0.7\mu$ below the substrate surface and has a dopant concentration of about $10^{16}$ atoms/cm$^3$.

6. The integrated circuit of claim 4 wherein the metal electrodes are an aluminum-silicon layer with about a 1% silicon dose.

7. An integrated circuit comprising a highly doped semiconductor substrate of a first conductivity type including a doped epitaxial semiconductor layer of the first conductivity type, the doped epitaxial layer including:

a vertical power transistor, a depletion-mode lateral MOS logic transistor and a lateral Schottky diode;

the depletion-mode lateral transistor and Schottky diode being in a well of a doped semiconductor material of a second conductivity type formed in the epitaxial layer;

the vertical power transistor and depletion-mode lateral transistor including semiconductor highly doped regions of the second conductivity type, the highly doped regions of the second conductivity type enabling ohmic contacts to be formed;

the lateral transistor and Schottky diode including a doped semiconductor channel layer of the first conductivity type formed during the same doping step, the vertical power transistor including a doped semiconductor channel layer of the second conductivity type;

the lateral transistor, Schottky diode and channel of the vertical power transistor including highly doped semiconductor regions of the first conductivity type, the highly doped semiconductor regions of the first conductivity type associated with the Schottky diode forming a ring around the doped semiconductor layer of the first conductivity type of the diode; and metal electrodes forming ohmic contacts on the highly doped semiconductor regions of the first conductivity type of the transistors and diode and one the doped semiconductor layer of the first conductivity type of the diode and on the highly doped regions of the second conductivity type;

the regions and layers of said Schottky diode being polarized and the regions and layers being arranged so that, when the diode is forward biased, no parasitic transistor in shunt with the power transistor is formed.

8. The integrated circuit of claim 7 wherein the doped semiconductor layer of the first conductivity type of the Schottky diode and the lateral transistor forms a junction about $0.7\mu$ below the substrate surface and has a dopant concentration of about $10^{16}$ atoms/cm$^3$.

9. The integrated circuit of claim 7 wherein the metal electrodes are an aluminum-silicon layer with about a 1% silicon dose.

10. An integrated circuit comprising a highly doped semiconductor substrate of a first conductivity type, the substrate including a doped epitaxial layer of the first conductivity type, the doped epitaxial layer comprising:

a vertical power transistor, a depletion-mode lateral MOS logic transistor and a lateral Schottky diode;

the depletion-mode lateral transistor and Schottky diode being in a well of a doped semiconductor material of a second conductivity type in the epitaxial layer;

the vertical power transistor and depletion-mode lateral transistor including semiconductor highly doped regions of the second conductivity type, the highly doped regions of the second conductivity type enabling ohmic contacts to be formed;

the lateral transistor and Schottky diode including doped semiconductor layers of the first conductivity type, the doped semiconductor layer of the first conductivity type of the Schottky diode forming a junction having a depth in the well of about $0.7\mu$ and a concentration of about $10^{16}$ atoms per cm$^3$;

the vertical power transistor including a doped semiconductor channel layer of the second conductivity type;

the lateral transistor, Schottky diode and channel of the vertical power transistor including highly doped semiconductor regions of the first conductivity type, the highly doped semiconductor regions of the first conductivity type associated with the Schottky diode forming a ring around the doped semiconductor layer of the first conductivity type of the diode; and metal electrodes forming ohmic contacts on the highly doped semiconductor regions of the first conductivity type of the transistors and diode and on the doped semiconductor layer of the first conductivity type of the diode and on the highly doped regions of the second conductivity type;

the regions and layers of said Schottky diode being polarized and the regions and layers being arranged so that, when the diode is forward biased, no parasitic transistor in shunt with the power transistor is formed.

11. The integrated circuit of claim 10 wherein the metal electrodes are formed in a single cathode sputtering metallization step as an aluminum-silicon layer with about a 1% silicon dose.

12. An integrated circuit comprising a highly doped semiconductor substrate of a first conductivity type, the substrate including a doped epitaxial semiconductor layer of the first conductivity type, the doped epitaxial layer including:

a power transistor, a depletion-mode lateral MOS logic transistor and a lateral Schottky diode;
  the depletion-mode lateral transistor and Schottky diode being in a well of a doped semiconductor material of a second conductivity type formed in the epitaxial layer during a first doping step;
  the power transistor and depletion-mode lateral transistor including semiconductor highly doped regions of the second conductivity type formed during a second doping step, the regions formed during the second step enabling ohmic contacts to be formed;
  the lateral transistor and Schottky diode including a doped semiconductor channel layer of the first conductivity type formed during a third doping step, the layer formed in the diode during the third step having characteristics similar to those of the channel of the lateral transistor formed during the third step;
  the power transistor including a doped semiconductor layer of the second conductivity type formed during a fourth doping step;
  the lateral transistor, Schottky diode and layer of the power transistor including highly doped semiconductor regions of the first conductivity type formed during a fifth doping step, the semiconductor region formed during the fifth step associated with the Schottky diode forming a ring around the layer of the diode formed during the third step; and
  metal electrodes on regions of the transistors and diode as formed during the fifth step and on the diode layer formed during the third step and on regions formed during the second step;
  the regions and layers of said Schottky diode being polarized and the regions and layers being arranged so that, when the diode is forward biased, no parasitic transistor in shunt with the power transistor is formed.

13. The integrated circuit of claim 12 wherein the layer formed during the third step forms a junction about 0.7$\mu$ below the substrate surface and has a dopant concentration of about $10^{16}$ atoms/cm$^3$.

14. An integrated circuit comprising a highly doped semiconductor substrate of a first conductivity type, the substrate including a doped epitaxial semiconductor layer of the first conductivity type, the doped epitaxial layer including:

a power transistor, a depletion-mode lateral MOS logic transistor and a lateral Schottky diode;
  the depletion-mode lateral transistor and Schottky diode being in a well of a doped semiconductor material of a second conductivity type in the epitaxial layer;
  the power transistor and depletion-mode lateral transistor including semiconductor highly doped regions of the second conductivity type, the highly doped regions of the second conductivity type enabling ohmic contacts to be formed;
  the lateral transistor and Schottky diode including a doped semiconductor channel layer of the first conductivity type, the doped semiconductor layer of the first conductivity type in the diode having characteristics similar to those of the channel of the first conductivity type of the lateral transistor;
  the power transistor including a doped semiconductor layer of the second conductivity type;
  the lateral transistor, Schottky diode and layer of the power transistor including highly doped semiconductor regions of the first conductivity type, the highly doped semiconductor region of the first conductivity type associated with the Schottky diode forming a ring around the doped semiconductor layer of the first conductivity type of the diode; and
  metal electrodes forming ohmic contacts on the highly doped semiconductor regions of the first conductivity type of the transistors and diode and on the doped semiconductor layer of the first conductivity type of the diode and on the highly doped regions of the second conductivity type;
  the regions and layers of said Schottky diode being polarized and the regions and layers being arranged so that, when the diode is forward biased, no parasitic transistor in shunt with the power transistor is formed.

15. The integrated circuit of claim 14 wherein the doped semiconductor layer of the first conductivity type of the Schottky diode and the lateral transistor forms a junction about 0.7$\mu$ below the substrate surface and has a dopant concentration of about $10^{16}$ atoms/cm$^3$.

16. An integrated circuit comprising a highly doped semiconductor substrate of a first conductivity type including a doped epitaxial semiconductor layer of the first conductivity type, the doped epitaxial layer including:

a power transistor, a depletion-mode lateral MOS logic transistor and a lateral Schottky diode;
  the depletion-mode lateral transistor and Schottky diode being in a well of a doped semiconductor material of a second conductivity type formed in the epitaxial layer;
  the power transistor and depletion-mode lateral transistor including semiconductor highly doped regions of the second conductivity type, the highly doped regions of the second conductivity type enabling ohmic contacts to be formed;
  the lateral transistor and Schottky diode including a doped semiconductor channel layer of the fist conductivity type formed during the same doping step, the power transistor including a doped semiconductor layer of the second conductivity type;
  the lateral transistor, Schottky diode and layer of the power transistor including highly doped semiconductor regions of the first conductivity type, the highly doped semiconductor regions of the first conductivity type associated with the Schottky diode forming a ring around the doped semiconductor layer of the first conductivity type of the diode; and
  metal electrodes forming ohmic contacts on the highly doped semiconductor regions of the first conductivity type of the transistors and diode and on the doped semiconductor layer of the first conductivity type of the diode and on the highly doped regions of the second conductivity type;

the regions and layers of said Schottky diode being polarized and the regions and layers being arranged so that, when the diode is forward biased, no parasitic transistor is shunt with the power transistor is formed.

17. The integrated circuit of claim 16 wherein the doped semiconductor layer of the first conductivity type of the Schottky diode and the lateral transistor forms a junction about $0.7\mu$ below the substrate surface and has a dopant concentration of about $10^{16}$ atoms/cm$^3$.

18. An integrated circuit comprising a highly doped semiconductor substrate of a first conductivity type, the substrate including a doped epitaxial layer of the first conductivity type, the doped epitaxial layer including:

a power transistor, a depletion-mode lateral MOS logic transistor and a lateral Schottky diode;

the depletion-mode lateral transistor and Schottky diode being in a well of a doped semiconductor material of a second conductivity type in the epitaxial layer;

the power transistor and depletion-mode lateral transistor including semiconductor highly doped regions of the second conductivity type, the highly doped regions of the second conductivity type enabling ohmic contacts to be formed;

the lateral transistor and Schottky diode including doped semiconductor layers of the first conductivity type, the doped semiconductor layer of the Schottky diode forming a conductivity type of the Schottky diode forming a junction having a depth in the well of about $0.7\mu$ and a concentration of about $10^{16}$ atoms per cm$^3$;

the power transistor including a doped semiconductor layer of the second conductivity type;

the lateral transistor, Schottky diode and layer of the power transistor including highly doped semiconductor regions of the first conductivity type, the highly doped semiconductor regions of the first conductivity type associated with the Schottky diode forming a ring around the doped semiconductor layer of the first conductivity type of the diode; and metal electrodes forming ohmic contacts on the highly doped semiconductor regions of the first conductivity type of the transistors and diode and on the doped semicondcutr layer of the first conductivity type of the diode and on the highly doped regions of the second conductivity type;

the regions and layers of said Schottky diode being polarized and the regions and layers being arranged so that, when the diode is forward biased, no parasitic transistor in shunt with the power transistor is formed.

19. The integrated circuit of claim 18 wherein the metal electrodes are formed in a single cathode sputtering metallization step as an aluminum-silicon layer with about a 1% silicon dose.

* * * * *